(12) United States Patent
Kearney et al.

(10) Patent No.: US 8,991,198 B2
(45) Date of Patent: Mar. 31, 2015

(54) COOLING SYSTEM CONTROL AND SERVICING BASED ON TIME-BASED VARIATION OF AN OPERATIONAL VARIABLE

(75) Inventors: Daniel J. Kearney, Ulster Park, NY (US); Rejean P. Levesque, Shefford, CA (US); K. Paul Muller, Wappingers Falls, NY (US); Andrew H. Vogel, Poughkeepsie, NY (US); Emmanuel Yashchin, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 415 days.

(21) Appl. No.: 13/442,897

(22) Filed: Apr. 10, 2012

(65) Prior Publication Data

US 2013/0263611 A1 Oct. 10, 2013

(51) Int. Cl.
*F25D 3/12* (2006.01)
*F25B 5/02* (2006.01)
*F25B 49/02* (2006.01)
(Continued)

(52) U.S. Cl.
CPC . *F28F 27/00* (2013.01); *F25B 5/02* (2013.01); *F25B 49/02* (2013.01); *F25B 2600/2513* (2013.01); *F25B 2700/2106* (2013.01); *F25B 2700/21152* (2013.01); *F25B 2700/21161* (2013.01); *F25B 2700/21162* (2013.01); *F25B 2700/21163* (2013.01); *F25B 2700/21174* (2013.01); *F25B 2700/21175* (2013.01); *H05K 7/20836* (2013.01)
USPC .................................................. 62/56

(58) Field of Classification Search
USPC ............ 62/56, 125, 132, 186, 259.2; 236/92; 361/679.53
See application file for complete search history.

(56) References Cited

U.S. PATENT DOCUMENTS

| 5,202,837 A | 4/1993 | Coe et al. |
| 5,596,507 A | 1/1997 | Jones et al. |
| 5,852,793 A | 12/1998 | Board et al. |

(Continued)

OTHER PUBLICATIONS

Kearney et al., Office Action for U.S. Appl. No. 13/775,509, filed Feb. 25, 2013 (U.S. Patent Publication No. 2013/0264044 A1), dated Jan. 15, 2014 (6 pages).

(Continued)

*Primary Examiner* — Melvin Jones
(74) *Attorney, Agent, or Firm* — Margaret A. McNamara, Esq.; Kevin P. Radigan, Esq.; Heslin Rothenberg Farley & Mesiti P.C.

(57) ABSTRACT

Automated control of a cooling system cooling at least one electronic component is provided. The control includes monitoring over a period of time variation of an operational variable of the cooling system or of the at least one electronic component, and based, at least in part, on variation of the operational variable over the period of time, automatically determining whether to adjust control of the cooling system to limit variation of the operational variable. In one implementation, depending on the variation of the operational variable, and whether control of the cooling system has been previously adjusted, the method may further include automatically determining a probability of fail or an expected residual life of the cooling system, and responsive to the predicted probability of fail exceeding a first acceptable threshold or the expected residual life being below a second acceptable threshold, automatically scheduling for a cooling system repair or replacement.

19 Claims, 13 Drawing Sheets

(51) Int. Cl.
*F28F 27/00* (2006.01)
*H05K 7/20* (2006.01)

(56) References Cited

U.S. PATENT DOCUMENTS

| | | | |
|---|---|---|---|
| 6,006,168 | A | 12/1999 | Schumann et al. |
| 6,226,597 | B1 | 5/2001 | Eastman et al. |
| 6,446,026 | B1 | 9/2002 | Dean et al. |
| 6,698,218 | B2 | 3/2004 | Goth et al. |
| 6,968,709 | B2 | 11/2005 | Goth et al. |
| 7,103,509 | B2 | 9/2006 | Shah et al. |
| 7,218,129 | B2 | 5/2007 | Beaman et al. |
| 7,346,468 | B2 | 3/2008 | Bashor et al. |
| 7,365,973 | B2 | 4/2008 | Rasmussen et al. |
| 7,808,783 | B2 * | 10/2010 | Goth et al. .................... 361/700 |
| 8,018,718 | B2 * | 9/2011 | Goth et al. .................... 361/699 |
| 2003/0000232 | A1 * | 1/2003 | Goth et al. ...................... 62/125 |
| 2004/0060305 | A1 | 4/2004 | Singh et al. |
| 2005/0109049 | A1 | 5/2005 | Chan |
| 2006/0176186 | A1 | 8/2006 | Larson et al. |
| 2006/0224254 | A1 | 10/2006 | Rumi et al. |
| 2006/0225433 | A1 | 10/2006 | Jammu et al. |
| 2007/0044493 | A1 | 3/2007 | Kearney et al. |
| 2007/0211430 | A1 | 9/2007 | Bechtolsheim |
| 2008/0245083 | A1 | 10/2008 | Tutunoglu et al. |
| 2009/0126910 | A1 | 5/2009 | Campbell et al. |
| 2009/0259347 | A1 | 10/2009 | Gross et al. |
| 2010/0094593 | A1 | 4/2010 | Reddy et al. |
| 2010/0274522 | A1 | 10/2010 | Sri-Jayantha et al. |
| 2010/0306598 | A1 | 12/2010 | Ackaret et al. |
| 2011/0057803 | A1 | 3/2011 | Yamaoka et al. |
| 2011/0224947 | A1 | 9/2011 | Kriss |
| 2013/0264044 | A1 | 10/2013 | Kearney et al. |

OTHER PUBLICATIONS

Notification of Transmittal of the International Search Report and the Written Opinion, issued for PCT Application No. PCT/IB2013/05173, dated Aug. 15, 2013 (10 pages).

* cited by examiner

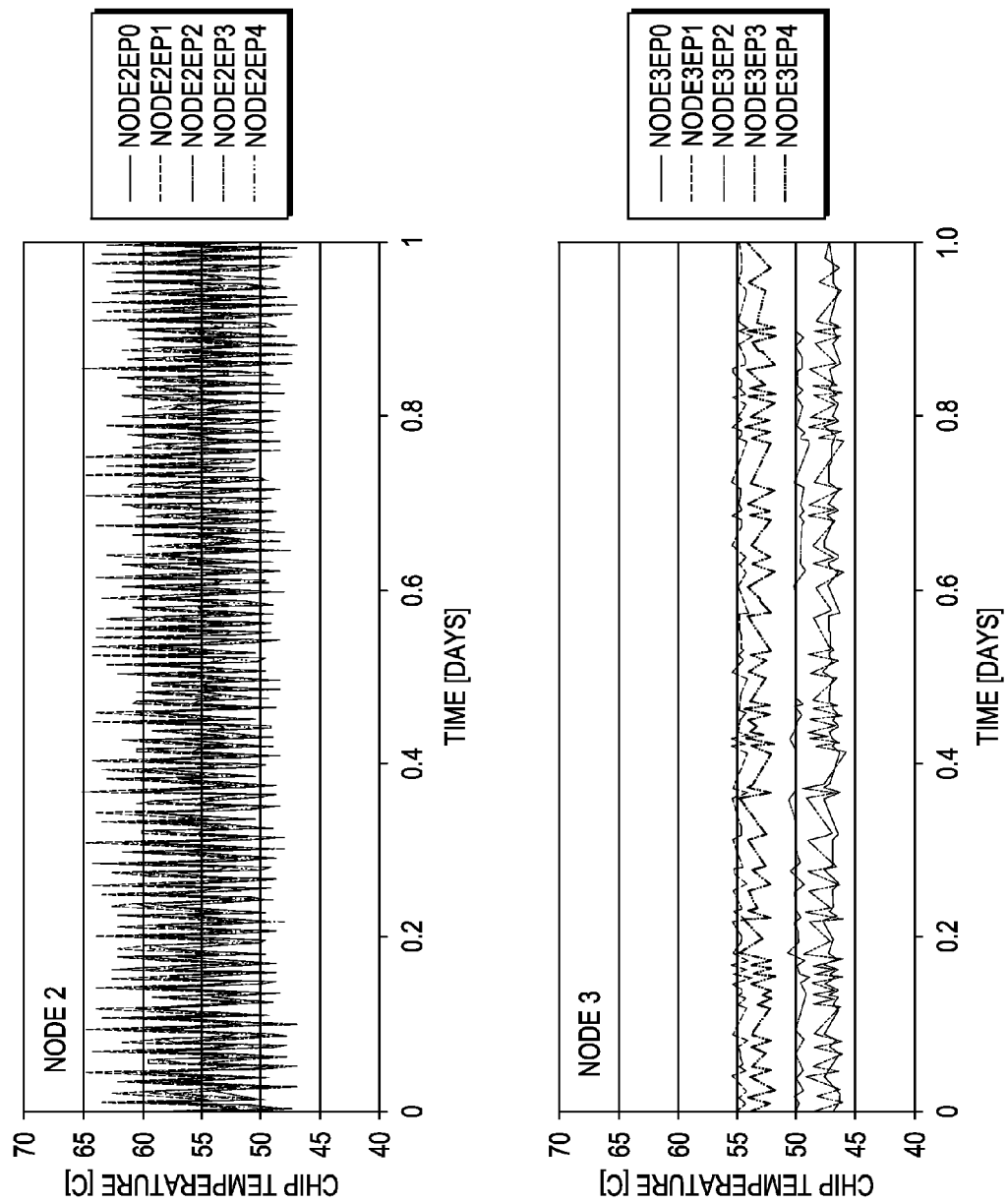

COOLING SYSTEM CONTROL AND SERVICING BASED ON TIME-BASED VARIATION OF AN OPERATIONAL VARIABLE

BACKGROUND

As is known, operating electronic devices produce heat. This heat should be removed from the devices in order to maintain device junction temperatures within desirable limits. Failure to remove heat can result in increased device temperatures, potentially leading to thermal runaway conditions. Several trends in the electronics industry have combined to make thermal management a significant consideration, including heat removal for electronic devices, particularly in technologies where thermal management has traditionally been less of a concern, such as CMOS. In particular, the need for faster and more densely packed circuits has had a direct impact on the importance of thermal management. First, power dissipation, and therefore heat production, increases as device operating frequencies increase. Second, increased operating frequencies may be possible at lower device junction temperatures. Further, as more and more devices are packed onto a single chip, power density (Watts/cm$^2$) increases, resulting in the need to remove more power from a given size chip or module.

An alternate approach to traditional air-cooling of electronic devices or components is to use a cooling liquid. In a cooling system comprising a cooling liquid, the cooling liquid may be in direct or indirect contact with the electronic component to be cooled. In particular, the performance and reliability of high-power CMOS circuits may be improved using liquid-cooling, such as refrigeration or water, rather than air-cooling. In such a system, performance of the liquid cooling system can be a significant factor in the performance of the electronic component (e.g., processor, multichip module, or server) being cooled.

One method of handling a significant degradation in observed temperature(s) for a component being cooled is to cut the clock speed employed, for example, in half. Such a method lowers the power being generated by the logic device sufficiently so that damage concerns due to high temperatures are eliminated. The approach is essentially simple thermal protection to prevent damage to the logic device or component. More proactive methods of cooling system monitoring and replacement would be commercially advantageous.

BRIEF SUMMARY

The shortcomings of the prior art are overcome and additional advantages are provided through the provision of a method of operating a cooling system cooling at least one component. The method includes, for instance, monitoring over a period of time variation of an operational variable of the cooling system or of the at least one component cooled by the cooling system, and based, at least in part, on the variation of the operational variable over the period of time, determining whether to adjust control of the cooling system to limit the variation of the operational variable.

Control systems and computer program products relating to one or more aspects of the present invention are also described and claimed herein. Further, services relating to one or more aspects of the present invention are also described and may be claimed herein.

Additional features and advantages are realized through the techniques of one or more aspects of the present invention.

Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of one or more aspects of the invention are apparent from the following detailed description taken in conjunction with the accompanying drawings in which:

FIG. 4A graphically depicts, for a given cooling loop and system node, oscillation of an operational temperature of multiple components (such as multiple processor chips of a MCM) being cooled by that cooling loop, in accordance with one or more aspects of the present invention;

FIG. 4B graphically depicts, for an alternate cooling loop and system node, oscillation in the operational temperature of multiple components being cooled by that cooling loop of the cooling system, in accordance with one or more aspects of the present invention;

DETAILED DESCRIPTION

As used herein, the term "electronics rack" includes any frame, rack, housing, blade server system, etc., having at least one heat generating electronic component of a computer system or electronic system, and may be, for example, a stand-alone computer processor having high, mid or low end processing capability. In one embodiment, an electronics rack may compromise multiple nodes or books, each having one or more heat-generating electronic components requiring cooling. Each "heat-generating electronic component" may comprise an electronic device, an electronic module, an integrated circuit chip, a multi-chip module, (comprising, for example, one or more processor chips), etc.

The word "refrigerant" is used herein to refer to any coolant which can be employed in a vapor compression/expansion system. One example of refrigerant within a cooling system in accordance with an aspect of the present invention is R-134A coolant (i.e., 1,1,1,2 tetrafluoroethane), however, the concepts disclosed herein are readily applied to other types of refrigerants, other dielectric fluids (e.g., fluorocarbon fluid), or other types of coolants while still maintaining the advantages and unique features of the present invention.

Generally stated, disclosed herein is an automated control facility for a cooling system cooling at least one electronic component. The control facility includes monitoring over a period of time variation of an operational variable of the cooling system or of the at least one electronic component, and based, at least in part, on variation of the operational variable over the period of time, automatically determining whether to adjust control of the cooling system to limit variation of the operational variable. In the implementations presented below, depending on the frequency and magnitude of the variation of the operational variable, and whether control of the cooling system has been previously adjusted, the method may further include automatically determining a probability of fail or an expected residual life for one or more elements of the cooling system, and responsive to the predictive probability of fail exceeding a first acceptable threshold or the expected residual life being below a second acceptable threshold, automatically scheduling for a cooling system repair or replacement.

Initially, FIGS. 1A-3B are described below as detailed examples of a cooling system and electronic component within which the control facility disclosed herein may be employed. Note in this regard that the control concepts presented below with reference to FIGS. 4A-9 may be implemented in combination with a cycle steering application, if desired for a particular application.

Figure 1A:
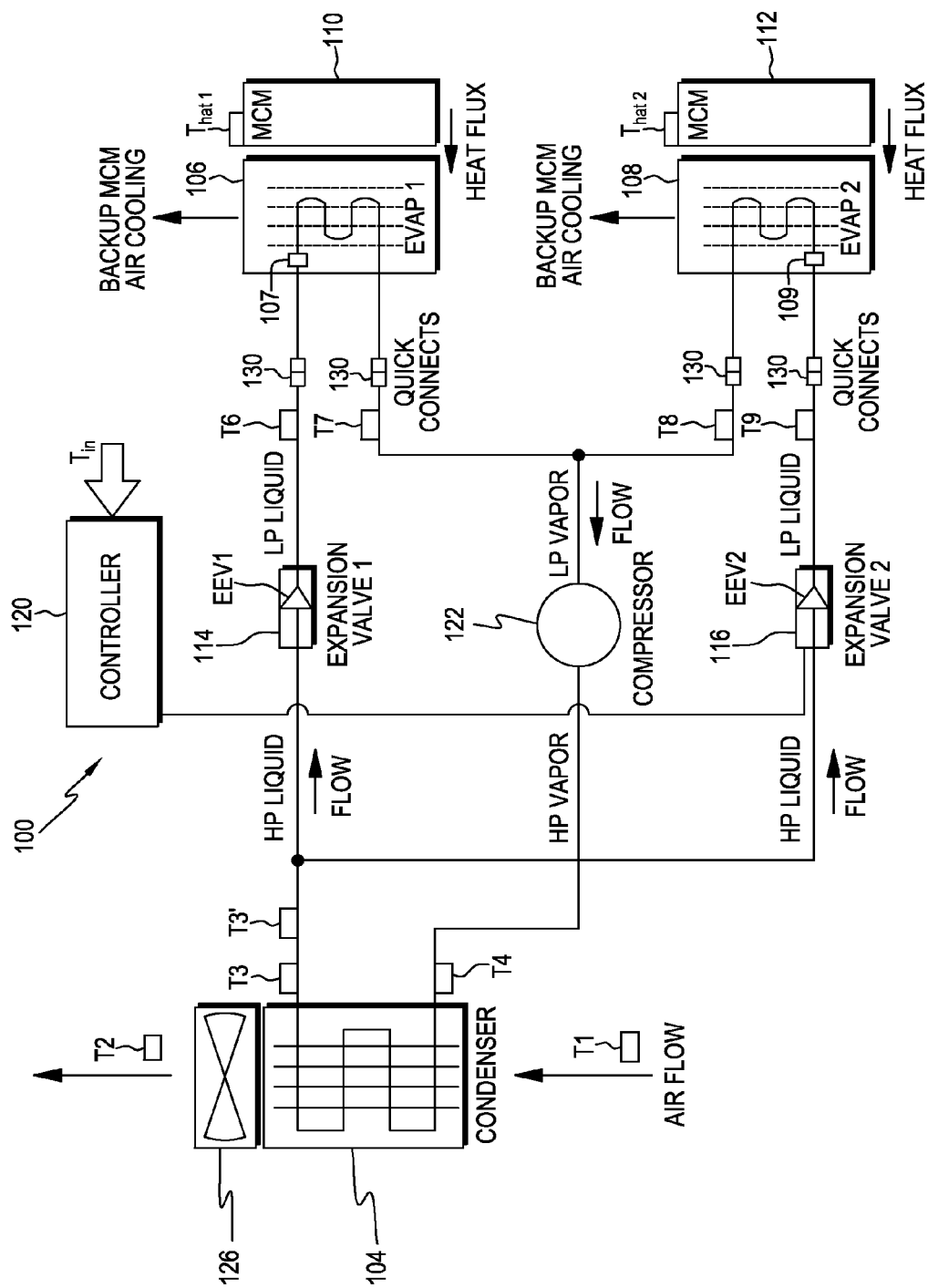
FIG. 1A depicts one embodiment of a cooling system comprising a modular refrigeration unit (MRU) or vapor compression refrigeration system cooling multiple electronic components of an electronic system, and which is to be controlled in accordance with one or more aspects of the present invention.

FIG. 1A depicts a cooling system 100 as an exemplary embodiment of the present invention. Cooling system 100 includes a condenser 104 and two evaporators 106 and 108. Evaporators 106 and 108 cool heat generating electronic components 110 and 112, respectively. In this embodiment, components 110 and 112 are each one or more multi-chip modules (MCMs), but it is understood that other components (e.g., single processors, memory) may be similarly cooled.

Both evaporators 106 and 108 are supplied refrigerant from a common condenser 104. An expansion valve 114 receives high pressure liquid refrigerant from condenser 104 and generates low pressure liquid refrigerant to evaporator 106. An expansion valve 116 receives high pressure liquid refrigerant from condenser 104 and generates low pressure liquid refrigerant to evaporator 108. Expansion valves 114 and 116 are electrically controllable. A controller 120 provides control signals to expansion valve 114 and expansion valve 116 to control refrigerant flow and pressure drop across each expansion valve. In an exemplary embodiment, expansion valves 114 and 116 each includes a stepper motor that responds to control signals from the controller 120. The stepper motor opens or closes an orifice in the expansion valve to regulate refrigerant flow and pressure drop. Controller 120 executes a computer program to control the expansion valves 114 and 116, in accordance with one or more aspects of the present invention.

The low pressure liquid refrigerant exits the expansion valves 114 and 116 and is supplied to evaporators 106 and 108, respectively. By way of example only, the refrigerant in each evaporator 106 and 108 is converted to a low pressure vapor refrigerant, in part, though further fixed expansion structure 107, 109, respectively, and subsequently provided to a common compressor 122. High pressure vapor from compressor 122 is supplied to condenser 104. Fan 126 establishes air flow across condenser 104 to facilitate cooling the high pressure vapor refrigerant to high pressure liquid refrigerant.

In one embodiment, a plurality of temperature sensors may be distributed throughout the cooling system 100. The sensors may be thermistors or other known temperature sensors. Sensor T1 measures air temperature entering condenser 104. Sensor T2 measures the temperature exiting condenser 104. Sensors T3 and T3' provide redundant measurement of refrigerant temperature exiting condenser 104. Sensor T4 measures refrigerant temperature entering condenser 104. Sensor T6 measures refrigerant temperature entering evaporator 106 and sensor T7 measures refrigerant temperature existing evaporator 106. Sensor T8 measures refrigerant temperature entering evaporator 108. Sensor $T_{hat1}$ measures temperature at electronic component 110 and sensor $T_{hat2}$ measures temperature at electronic component 112.

Each temperature sensor employed generates a temperature signal which is supplied to controller 120 and shown as $T_{in}$. In one embodiment, the control or controller 120 may automatically adjust the expansion valves 114 and/or 116 in response to one or more of the temperature signals to, for example, maintain the electronic component logic modules 110 and 112 at a predefined temperature. In one aspect, controller 120 controls expansion valves 114 and/or 116 to obtain desired superheat valves while maintaining each electronic component at a desired temperature. Each component 110 and 112 may be maintained at a different temperature or the same temperature, even if the components have different heat loads.

Evaporators 106 and 108 may be connected to the refrigerant supply and refrigerant return lines through quick disconnect connectors 130. The controllable expansion valves 114 and 116 allow an evaporator to be removed for maintenance or upgrade while the other evaporator, condenser and compressor continue to operate. For example, expansion valve 114 can be closed and the refrigerant from evaporator 106 removed by the suction of the compressor 122. Evaporator 106 can then be removed for service, upgrade, etc.

Although two evaporators are shown connected to one modular refrigeration unit (MRU) (condenser, compressor, expansion valves and controller), it is understood that more than two evaporators may be coupled to each MRU, each via a respective cooling loop.

Figure 1B:
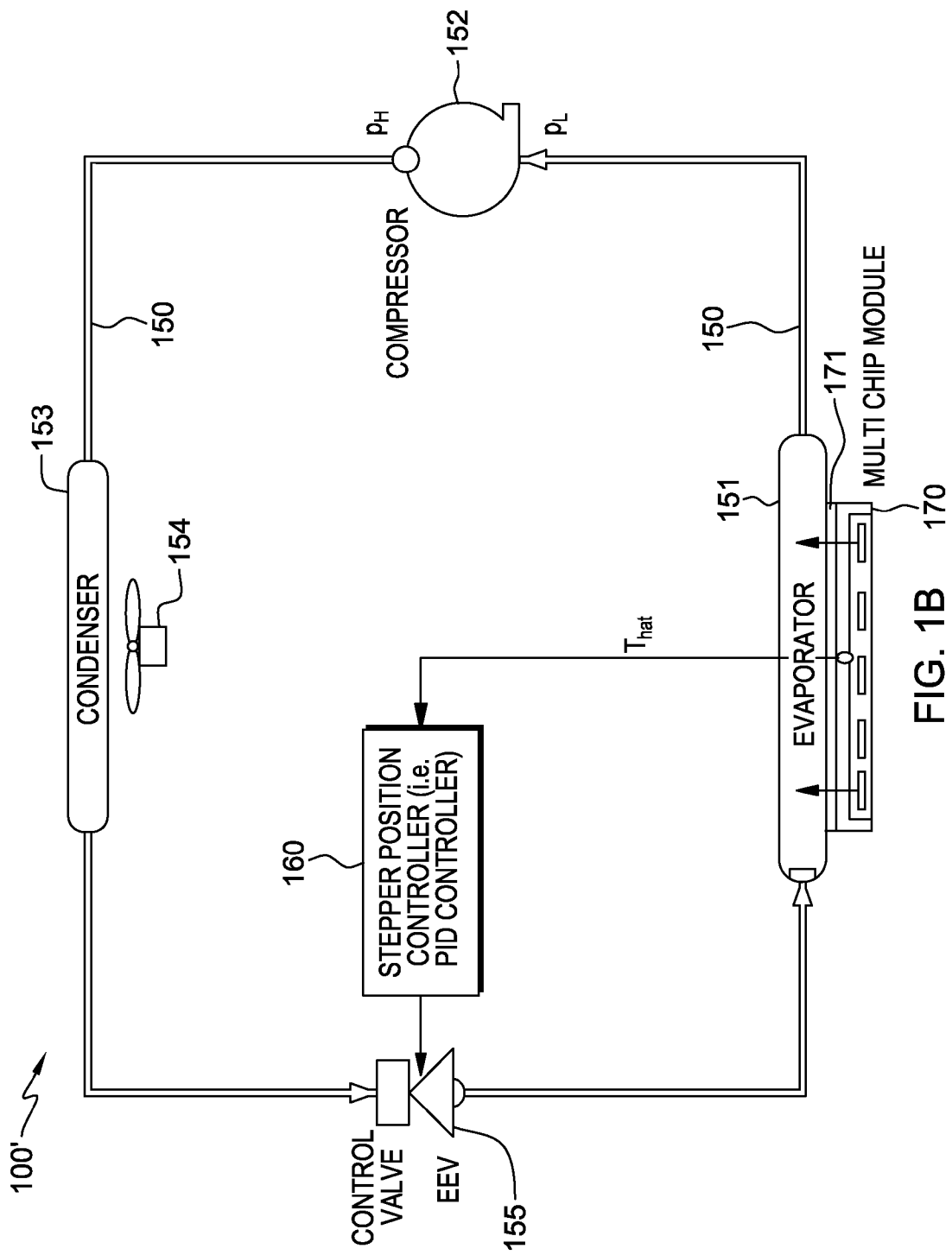
FIG. 1B depicts one embodiment of a cooling loop of a cooling system (such as the MRU depicted in FIG. 1A) cooling an electronic component, such as a multichip module, in accordance with one or more aspects of the present invention.

FIG. 1B is a simplified depiction of one embodiment of a cooling system 100'. In this cooling system 100', a single cooling loop 150 is illustrated comprising an evaporator 151, a compressor 152, a condenser 153 with an associated air-moving device 154, an electronic expansion valve 155, and a control 160, such as stepper position controller or proportion-integral-derivative (PID) controller. As illustrated, evaporator 151 is coupled to an electronic component 170, such as a multichip module employing, for example, a thermal interface material 171. A temperature sensor $T_{hat}$ measures temperature at electronic component 170 and provides the temperature reading to controller 160 for use in automatically adjusting electronic expansion valve 155 to, for example, control temperature of refrigerant passing through evaporator 151. In accordance with aspects of the present invention, variation of the temperature $T_{hat}$ may be monitored over a period of time and employed in determining whether to automatically adjust control of the cooling system to, for example, limit variation of the temperature sensed at sensor $T_{hat}$.

Figure 2:
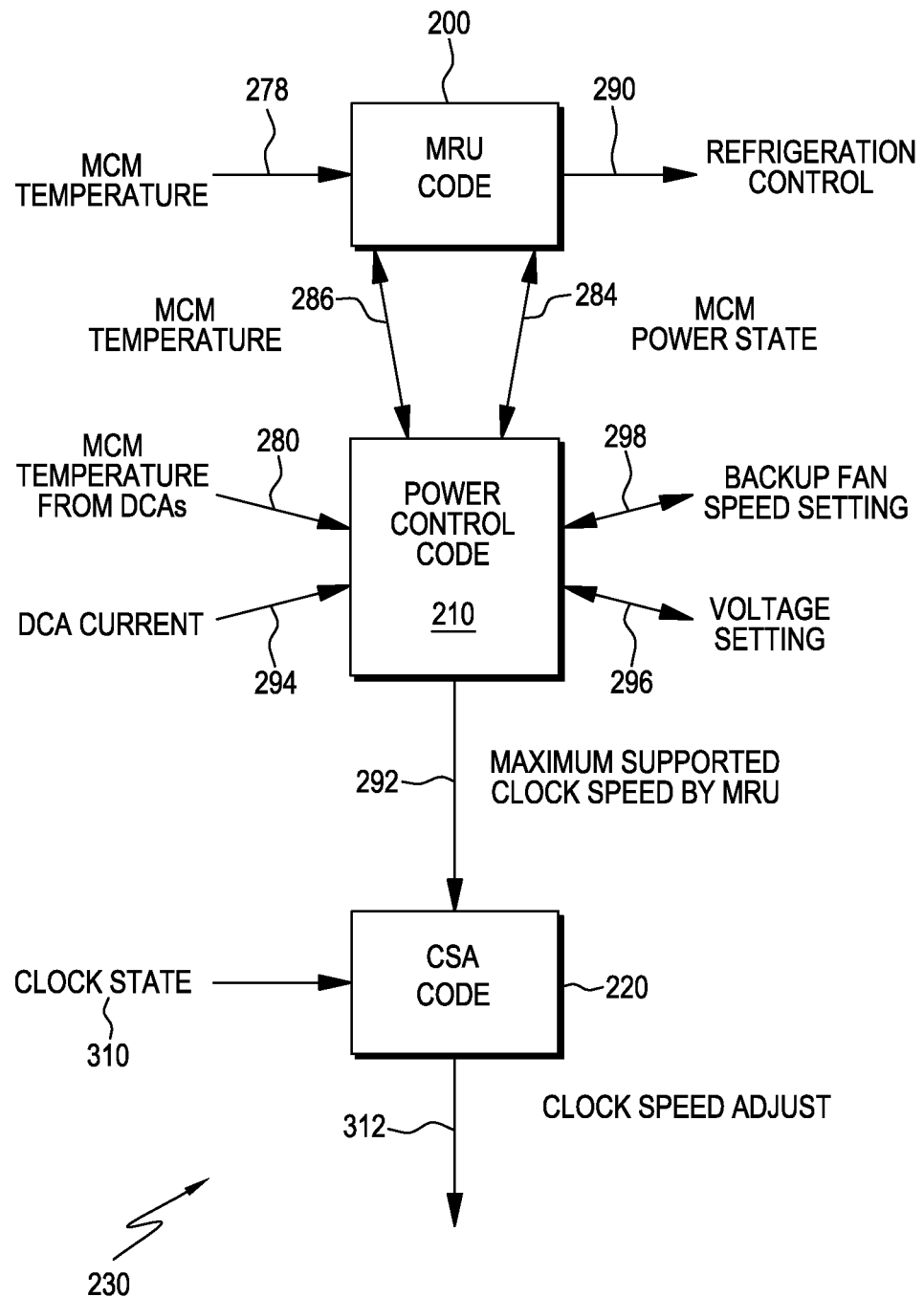
FIG. 2 illustrates one example of a flowchart that shows how a modular refrigeration unit (MRU) code which contains a method to regulate multi-chip module (MCM) temperature under primary MRU cooling, a power control code (PCC) which contains a method to determine and communicate the thermal state or range that equates to a specific temperature and voltage condition, and a Cycle Steering Application (CSA) code which contains a method of matching the various logic clocks to the thermal degrade states that exist, may interact in a single temperature-power-logic control system, in accordance with one or more aspects of the present invention.

By way of further detailed example, one embodiment of one method of monitoring and controlling the temperature of a hybrid cooling system 100 is described below with reference to FIGS. 2 and 3A. FIG. 2 illustrates a flowchart that shows how a Modular Refrigerant Unit (MRU) code 200, which contains a method to monitor and regulate the MCM (or more generally, electronic component) temperature under primary MRU cooling, by interface with a Power Control Code (PCC) 210, which contains a method to determine and communicate the thermal state or range that equates to a specific temperature and voltage condition of each MCM, and a Cycle Steering Application (CSA) code 220, which contains a method of matching the various logic clocks to a thermal degrade state that exists. In one embodiment, the MRU code, PCC code and CSA code, all interact to form a single temperature-power-logic control system generally indicated as 230.

Figure 3A:
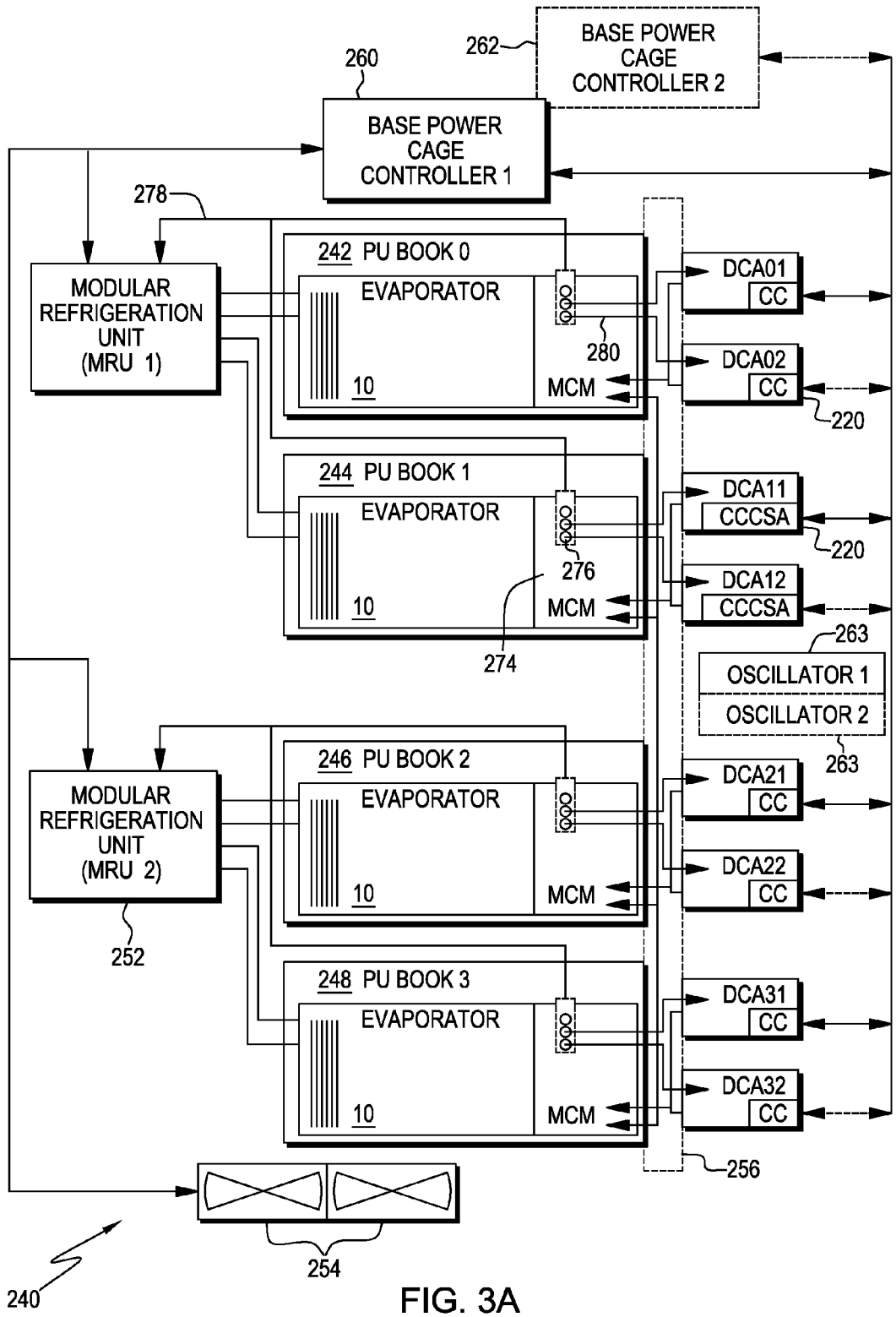
FIG. 3A depicts a system schematic where the MRU code, PCC code, and CSA code are physically located in a server having four processor books or nodes, cooled in primary mode by two MRUs, and in back-up mode by blowers, and controlled in accordance with one or more aspects of the present invention.

FIG. 3A shows one embodiment of a system schematic wherein MRU code 200, PCC code 210 and CSA code 220 are physically located in a server that has four Processor (PU) books or nodes 242, 244, 246, 248, respectively, each having at least one electronic component or MCM cooled in primary mode by one of two MRUs 250, 252 and in backup mode by two blowers 254. The backup blowers 254 provide air cooling of all PU books 242, 244, 246, 248, for example, in case of an MRU failure or a light logic load state. Each MCM is operably connected to a main system board generally indicated at 256. The MRU code 200 is in each MRU 250, 252. The PCC code 210 is split between Base Power Cage Controllers or Base Power Assemblies 260, 262 and digital converter assemblies (DCA) cage controllers (DCA 01, 02, 11, 12, 21, 22, 31, 32). The Base Power Assemblies 260, 262 provide high voltage DC power to the entire server 240 and the DCAs convert the high DC power to low DC voltages used by each circuit. The CSA code 220 may be located in the first Processor book 244 (labeled PU Book 0) of multi-node server 240.

Each MCM (not shown) in each PU book 242-248 may, in one embodiment, include a hat 274 in operable communication with a cooling unit 10 and connected to a thermal sensor assembly 276. Each thermal sensor assembly 276 may include, for example, three thermistors configured to sense a temperature of a corresponding MCM.

The thermal sensors may be compared for miscompare properties and for meaningful values to make sure the temperatures measured are accurate. In one embodiment, one sensor may be directly sensed by the Modular Refrigeration Unit (MRU) indicated generally at 278 and the other two by the power supply feeding the MCM power indicated generally at 280 to insure redundancy and accuracy of the reading. The MRU may read an MCM hat thermistor sensor directly through its drive card to enable continual monitoring and thermal regulation in case of a cage controller (cc) failover. MCM hat thermistors that are read by each DCA power supply as well as by the MRU may be compared to each other by the MRU and Power Control Code to identify any faulty sensors and eliminate the faulty sensors from consideration generally indicated at 286 in FIG. 2. This insures redundancy of control and cooling status function. The power supply thermistor also serves as thermal protection of the MCMs, dropping power if the temperatures are near damage limits.

The control of the primary cooling system is done by using a Proportional Integral Derivative (PID) control loop of an electronic expansion valve to each evaporator as described with reference to FIGS. 1A & 1B, and generally indicated at 290 in FIG. 2. The PID control loop regulates the coolant flow to each MCM being cooled. Coolant flow is increased by opening the electronic expansion valve in the respective cooling loop if (for example) the MCM is too warm or is higher than targeted and coolant flow is reduced by closing the valve position if (for example) the MCM is too cold or cooler than targeted.

When the PID control has opened an electronic expansion valve to the fully open position, providing maximum coolant to a given MCM, the compressor speed may then execute its own PID control loop to deliver additional cooling capacity to the MCM. In other words, a second PID control loop may control the compressor speed if the valve regulating the flow of coolant to a respective evaporator has reached its maximum cooling position.

Similarly, the blower speed of blower 126 cooling the refrigerant condenser 104 may be controlled based on the cooling capacity needs from the MRU. More specifically, blower speed controls may provide more air for cooling the MRU condenser 104 when the thermistors T1 and T2 on the condenser 103 and ambient air indicate that inadequate condensing is taking place. Also, the speed of condenser blower 126 may be increased in a warm ambient.

In one embodiment, MCM power data 284, read by the Power Control Code 210 and provided to the MRU code 200 every few (e.g., 2.5) seconds, determines if a given MCM no longer has its clocks functioning. If the MCM power stays low (indicating a non-functional Processor book) for sufficient time, then the refrigerant coolant supply is stopped by completely closing the expansion valve in the cooling loop to that MCM only and turning on the backup blowers 254 at a reduced speed. In this manner, other MCMs in the same server can stay refrigerant cooled while the MCM that has clock-stopped or otherwise ceased to function logically will be air cooled. Refrigerant cooling of an MCM without adequate logical power can lead to condensation forming on its external surfaces. For example, when regulating light heat loads to a fixed temperature, the expansion device must significantly close the refrigerant flow rate, which lowers the pressure and hence the refrigerant temperature inside the evaporator cooling that MCM. when the clocks are off, the expansion valve closes so far that the evaporator pressure may be sub-atmospheric, which creates very cold local temperatures. With these cold local temperatures with low heat flux, outside regions of the MCM can get cold enough to form condensate after extended operation in this condition.

The MRU code 200 also provides a function that enables virtually all of the refrigerant to be removed from the evaporator of a corresponding cooling unit before the refrigerant lines are opened for servicing the MCM or cooling hardware. This can be provided by closing the electronic expansion valves for some period before turning off the compressor(s), resulting in a partial vacuum that removes the refrigerant from the evaporator and connecting hoses, which advantageously provides better ecology and consistent refrigerant charge before and after the MRU is reconnected.

Still referring to FIGS. 2 and 3A, one detailed description of the Power Control Code (PCC) 210 which principally includes a method for monitoring the actual thermal or degrade state and for making suitable power and cooling adjustments, as well as reporting this state to the CSA code 220, follows below. In one embodiment, the thermal states of each MCM are monitored and the state of each MCM is communicated to a function that determines the proper clock cycle time, called the Cycle Steering Application (CSA) code 220. This function tells the CSA code 220 both which cycle time range of the circuits are now operating in and whether the cause of a failure of the primary cooling means has been repaired or not.

In particular, PCC 210 continually monitors and posts "cooling state" data to the CSA code 220 indicated generally as 292. The thermal state is defined by discrete temperature ranges that are associated with a given clock speed as the proper speed to operate. In other words, the full operating temperature range from coldest to ambient to shut-down for thermal protection is subdivided into smaller discrete operating ranges. The coldest steady state temperature range is called the normal state, and is the temperature range kept under normal primary cooling means (e.g., MRUs 250, 252 and cooling units 10). When the primary cooling means no longer functions properly, the cooling state, sensed via the MCM sensors 276, may be reported as a specific "degrade state". By way of example, there may be between 2 and 4 degrade states between normal operation and thermal shut-down, but more or less are also contemplated, and hence, these concepts are not limited to between 2 and 4. Within a given degrade state, there exists one "optimum" set of clock speeds.

The PCC 210 reads the actual current 294 and voltage 284 being supplied to each MCM as well as its temperature 286. Based on the leakage characteristics of the CMOS technology, the capacity left in the power supply providing the current to the MCM, and operating temperatures, the PCC 210 may either increase or decrease or leave along the applied voltage level to each set of circuits indicated generally 296.

When the voltage is increased, the increased voltage enables a higher range of operating temperatures before a given degrade state is indicated by the CSA code 220 to slow the clocks. Hence, the higher voltage can delay the need to operate in a slower clock range. This is because CMOS switches are faster at higher voltages, somewhat offsetting the slowing effects of warmer circuits.

Normally, it is desirable to increase voltage applied to the circuit to offset some of the slowing effect on circuit switching of warmer circuits. Typically, a 6% increase in voltage will cause circuits to switch about 4% faster, offsetting a 25° C. temperature rise. However, with recent circuit technology, power increases strongly with higher temperature and increased voltage. In some cases it may require the voltage to be dropped when the junction temperature rises significantly, even though this lowering of voltage will increase the amount of slowing of the clock frequency that is needed. There are three possible responses to loss of normal cooling: doing nothing, increasing voltage, and lowering voltage. A voltage alteration may be done to all components in a system or just to specific electronics components that are exceeding normal cooling limits.

The Cycle Steering Application (CSA) code 220 provides a fail-safe method of adjusting the clock speeds in an optimum manner when the cooling state changes. This method of clock speed adjustment includes determining if a cooling failure has been repaired prior to increasing the clock speeds to prevent oscillating clock speeds. It should be noted that the clock speed follows the temperature and voltage conditions a all times. Further, the time from a change of circuit temperature to a corresponding change in clock speed is slow enough that the temperatures of the circuits change minimally, less than about 1° C., during this process.

The CSA node 220 includes an interrupt handler that reads directly from the PCC 210 the cooling state of each MCM as well as receiving interrupts on these states.

For systems with multiple processor books or nodes, the CSA code 220 determined which MCM has the slowest cooling state. This is the state that governs the safe clock speed of the system indicated generally at 310 in FIG. 2. The multiple clock boundaries on multiple oscillators with predefined ratios are always maintained.

The CSA code 220 determines if any cooling defective hardware registers are set whenever a cooling state is increased calling for a faster clock speed. If the hardware defect register is set, it means the cause of the cooling degradation has not yet been fixed and the change in cooling state is likely due to transient change in ambient or other transient conditions. Hence, the server clock speeds are not re-adjusted faster until the defective cooling hardware is replaced and the register cleared. This is true even after the machine is re-initial microcode loaded or rebooted. If there is uncertainty in the cooling state due to communication problems, the slowest, safest cooling state is employed by the CSA code 220.

When the CSA code 220 determines it is appropriate to make a change in several clock speeds, it alters the phase look loops (PLL) on the clock synthesizers in a sequence of very small steps until its new targeted clock speed is reached generally indicated as 312. The phase lock loops are stepwise changed, always retaining the optimum operating ratio between the various clocks that may be affected. The steps are sufficiently small to pose no risk to proper operating due to change in clock ratios during this adjustment process.

Every step is performed in a two step commit algorithm, e.g., the current step and the next step PLL values are saved in a persistent storage concept made up by using SEEPROMS residing on the current and backup cage controller 262, 262. After the change is written to the PLL and read back for verification, the saved current value is updated. This is done to provide protection in case a speed change is interrupted by a cage controller switchover.

The width of the small steps taken on the phase lock loops is less than the normal jitter of the phase lock loop normal output. This allows the step variation not to be detected by the target clock receiving circuitry. In this manner, all of the affected clocks are stepped in small increments until the targeted clock speed is achieved.

The PLLs are on two oscillator cards 263, one in charge, one in backup mode. At all times the optimum ration between clocks is maintained as the phase lock loops are moved in minimal increments or decrements.

Prior to power good time, the CSA code 220 issues a "Pre-Cooling" command to insure that the MCM temperatures are in proper normal state prior to turning on the clocks. This also prevents a sudden spike in temperature from a surge of power when the CMOS logic begins to switch. Without pre-cool, the temperature spike could cause a quick degrade state to occur because the refrigerant system takes some time to get is cooling cycle established. When pre-cooled state is reached the PCC 210 notifies the CSA code 220 of the same and IML is initiated.

The PLLs are initially loaded with a pattern, which is hard wired on the cards and loaded in parallel at power good time. Normally, PLLs are loaded serially, but this is exposed to shift errors which would lead to wring clock speed settings.

The exact process of initializing clocks includes first verifying the right oscillator card 263. Then, the pattern matching the actual system speed is loaded into the line drivers and read back to insure that there are no errors or hardware failures. Next, the loaded and verified pattern is read into the phase lock loops, with this pattern again read back to be verified. Now the system clock is started using the phase lock loop output as input. At the completion of IML, the system is degraded to it slowest clock state and upgraded back to its normal state with the required number of small incremental steps to the phase lock loops. This insures that all necessary patterns can be loaded into the phase lock loops without system error. This process takes a fraction of a second to complete on every server that is IMLed.

The pattern to be loaded for speed adjustment purposes such as when going from one cooling state to another is generated by a set of digital I/O lines controlled by the FGAs DIO engines, which is a part of the cage controller (cc) hardware. The FGAs DIO engines are digital I/O lines controlled by cage controller code that interface to the PLLs that control the system oscillators 263. They are CSA code driven which is running on the PU Book 0 cage controller (cc). Before changing the PLL pattern due to a change in cooling state, the existing pattern is monitored to make sure the adjusting processes were not interrupted, by saving the line settings of the current pattern.

The CSA code 220 issues a warning server reference code (SRC) to the operator whenever the CSA code leaves normal clock speed. When the service is completed, the PCC 210 removes the error states and interrupts the CSA code 220. The CSA code 220 removes SRC once notified.

The CSA code 220 monitors the actual speeds used for an IML to assure these speeds are never increased in actual operation even though the cooling state later permits the increased speed. The reasons for this is that the initialization of "Elastic Interfaces" (EI) done during IML allows only the speed reduction and its clearing, not faster speeds than those present during IML initialization and self-tests.

Hence, the CSA code 220 notifies the operator that re-ILM should be avoided while a cooling failure service register is flagged so that when the cooling hardware problem is repaired, the server can return to its fast normal speed without needing a subsequent re-IML. Also contemplated is a repair and verify procedure that verifies that the clocks have returned to full speed while a customer engineer is present.

The above-described cycle steering approach is essentially a thermal protection approach to preventing damage to the logic device or component by reducing clock speed, and thus logic performance. Alternative methods of cooling system monitoring and predictive repair/replacement are presented herein and described below with reference to FIGS. 3B-9.

Figure 3B:
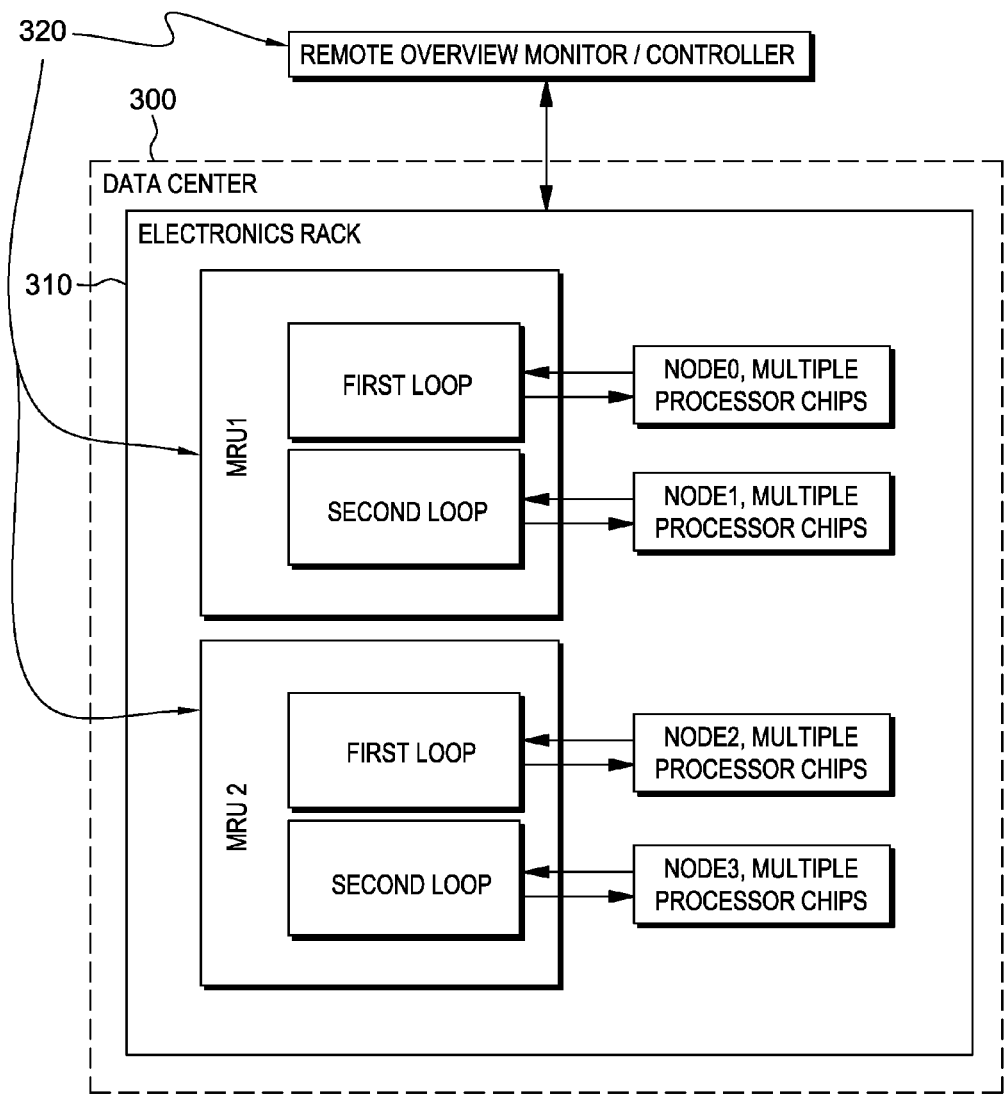
FIG. 3B is a simplified schematic of a system comprising a remote overview monitor/control coupled to a data center comprising one or more electronics racks, with one electronics rack being illustrated comprising two MRUs cooling, via respective cooling loops, respective books or nodes of the electronic system, in accordance with one or more aspects of the present invention.

FIG. 3B is a simplified depiction of one embodiment of a data center 300 comprising one or more electronics racks 310 and a cooling system 320 comprising a first modular refrigeration unit (MRU1) and a second modular refrigeration unit (MRU2), each comprising a first cooling loop and a second cooling loop cooling respective nodes of a respective electronics rack 310. In this embodiment, each node comprises multiple processor chips, such as five processor chips. The cooling system 320 further includes a remote overview monitor/controller, which may be disposed within the data center or remote from the data center. In one implementation, the remote overview monitor/controller is remote from the data center and collects cooling information from a plurality of data centers, each of which may comprise multiple electronics racks, one or more of which may include cooling system elements such as depicted in FIG. 3B. In one specific embodiment, the remote overview monitor/controller is implemented as part of an offered monitoring service providing predictive failure analysis and/or expected residual life analysis on the cooling systems of one or more data centers.

In the graph of FIG. 4A, one of the nodes (node 2) of the electronics rack depicted in FIG. 3B, has temperature of, for example, its five processor chips (NODE2EP0, NODE2EP1, NODE2EP2, NODE2EP3, NODE2EP4) monitored and plotted over the course of a day. As described herein, chip temperature is one example of an operational variable that may be monitored over a period of time, such as a 24-hour cycle. Other operational variables might include temperature of coolant passing through the respective coolant loop of the cooling system, power consumed by the processor chips being cooled, work being performed by the processor chips, etc. Note also that as used herein, the term "operational variable" relates to or characterizes performance of the cooling system itself or the one or more components being cooled by the cooling system. Severe performance modulations in an operational variable over a period of time have been discovered to correlate to cooling system failures. Thus, predictive analysis is also described herein, which allows for proactive scheduling of servicing or replacement of a cooling system based, at least in part, on monitored variations of the chosen operational variable over a defined period of time. Processor chip temperature is thus discussed herein as one example only of an operational variable which may be employed with the operational and predictive control concepts disclosed herein.

As illustrated in FIG. 4A, one or more nodes of the monitored electronics rack may have strong or significant modulations over the period of time during which chip temperature is monitored. In FIG. 4B, temperature modulations of a different node (node3) are plotted, wherein the modulations in processor chip temperatures are significantly less than those plotted in FIG. 4A. As described herein, the reduced modulations of FIG. 4B are preferred for operation of the cooling system. Strong modulations in an operational variable, such as temperature of the processor chips, can be detrimental to the longevity of the cooling system. For example, strong modulations accelerate mechanical wear-out, lead to performance degradation of the processor chips (such as lower-on currents, and higher-off currents at high temperatures), lifetime degradation of processor chips, for example, higher Negative Bias Temperature Instability (NBTI) at high temperatures, and are correlated to a reduced lifetime of the cooling system, e.g., refrigeration system, such as the above-described modular refrigeration unit (MRU).

The solution proposed herein is to assume causality between strong operational variable modulations over a monitored period of time and cooling system lifetime. Thus, in addition to monitoring and dynamically adjusting control of a cooling system to limit variation of an operational variable, disclosed herein is an automated predictive failure analysis for one or more elements of the cooling system and/or expected residual life analysis for one or more cooling system elements, which (in one implementation) may be periodically performed, depending upon the monitored oscillations of the operational variable.

Figure 5:
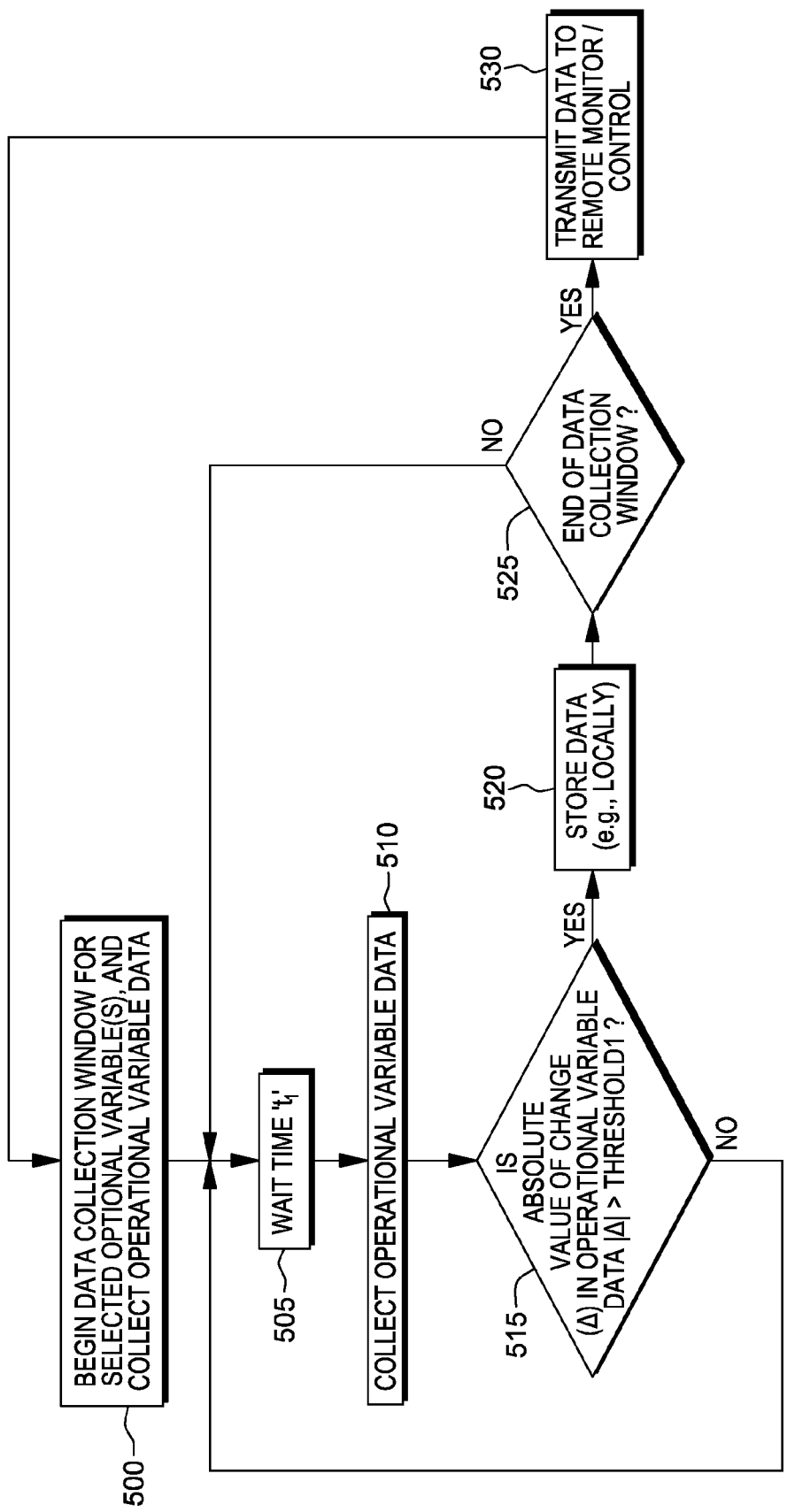
FIG. 5 is a flowchart of one embodiment of a process for evaluating oscillation of an operational variable of a cooling system or of a component being cooled by the cooling system, and for storing selected oscillation data and transmitting the data to a remote monitor/control, in accordance with one or more aspects of the present invention.

FIG. 5 depicts one embodiment of a process for monitoring variation of an operational variable of a cooling system or of a component being cooled by the cooling system over a period of time, and for storing selected oscillation data and transmitting the data to a remote monitor/control, in accordance with one or more aspects of the present invention.

The process begins by initiating a data collection window (i.e., period of time) collecting operational variable data, such as a 24-hour period, and collecting operational variable data 500. After collecting the first operational variable data, processing waits a time interval $t_1$ 505, before again collecting operational variable data 510. In the embodiment depicted, processing then determines whether the absolute value of the change in the operational variable data ($\Delta$) between the two most recent collection points is greater than a first acceptable threshold (threshold1) 515. If "no", then processing returns to wait time interval $t_1$ before again collecting operational variable data, and determining whether the absolute value of the change ($\Delta$) in operational variable data between the last two collection points is greater than threshold1 515. If the change in the absolute value of the operational variable data is greater than threshold1, then processing stores that change information (for example, locally) 520. The process repeats until reaching the end of the specified data collection window 525, at which point the data may be transmitted to the remote monitor/control 530 for further analysis, as described herein. Thereafter, processing initiates a next data collection window, and repeats the process.

By way of specific example, if the operational variable is a temperature of the component being cooled, such as temperature of one or more processor chips of a node, then the processing of FIG. 5 may include every time interval $t_1$ (e.g., every five minutes), determining whether one of the processor chips in the node moves in temperature up or down more than the acceptable threshold1, e.g., 2° C., relative to the previously collected operational variable data. If that is the case, then the change is stored locally, for example, within the electronics rack or data center, and at the end of a specified time, for example, once a day or once a week, the stored operational variable changes exceeding threshold1 may be transmitted to the remote monitor/control. Note that the length of the data collection window, as well as the frequency of data collection and/or the frequency of transmission, need not be constant or predetermined, but could, for example, be dynamically determined or altered via the remote monitor/control.

As noted above, in one example, the operational variable is a temperature associated with the cooling system or the one or more components being cooled by the cooling system. For example, the operational variable may be temperature of a processor chip or node being cooled by a cooling loop of the cooling system. As part of the monitoring of operational variable data changes, processing can determine a variable referred to herein as the "daily oscillation metric". In one embodiment, the daily oscillation metric is defined herein to comprise a sum of operational variable changes over a defined threshold in each set of data collected. Note in this regard, that the processing of FIG. 5 may be performed, in one embodiment, for each cooling loop of the cooling system within an electronics rack. Each cooling loop may be cooling one or more components of the electronics rack, such as a node of the rack comprising multiple processor chips. The daily oscillation metric (DOM) advantageously combines two aspects of operational variable data monitoring. Specifically, frequent operational variable changes may be detrimental to the cooling system. In addition, high-amplitude operational variable changes may be detrimental to the cooling system. The DOM captures these changes in a single daily metric.

In one aspect, described herein below with reference to a cooling system comprising one or more refrigeration units is a process for automatically adjusting control, such as via proportional-integral-derivative (PID) control parameters of the refrigeration unit(s). PID control is a generic control loop feedback mechanism, and PID control parameters include a proportional gain, an integral gain, and a derivative gain. Table 1 depicts sample control parameter values for a refrigeration unit's PID parameters before and after a dynamic change in control to, for example, ensure less aggressive and slower variation of the operational variable within the monitored period of time, and subsequently, less oscillation.

TABLE 1

|  | Before Change | After Change |
| --- | --- | --- |
| Proportional Gain | 1.5 | 0.9 |
| Integral Gain | 3.0 | 2.5 |
| Derivative Gain | 0.4 | 0.3 |

Figure 6A:
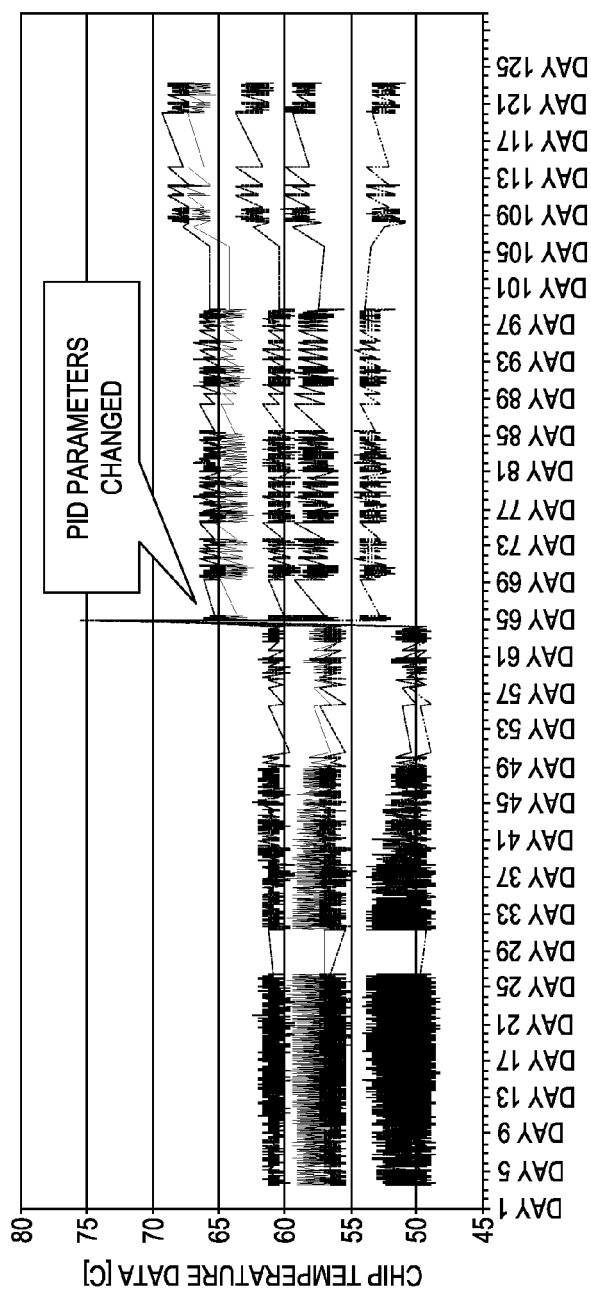
FIG. 6A graphically depicts oscillation of chip temperature of a multichip component being cooled by a cooling system having proportional-integral-derivative parameters dynamically changed, in accordance with one or more aspects of the present invention.
Figure 6B:
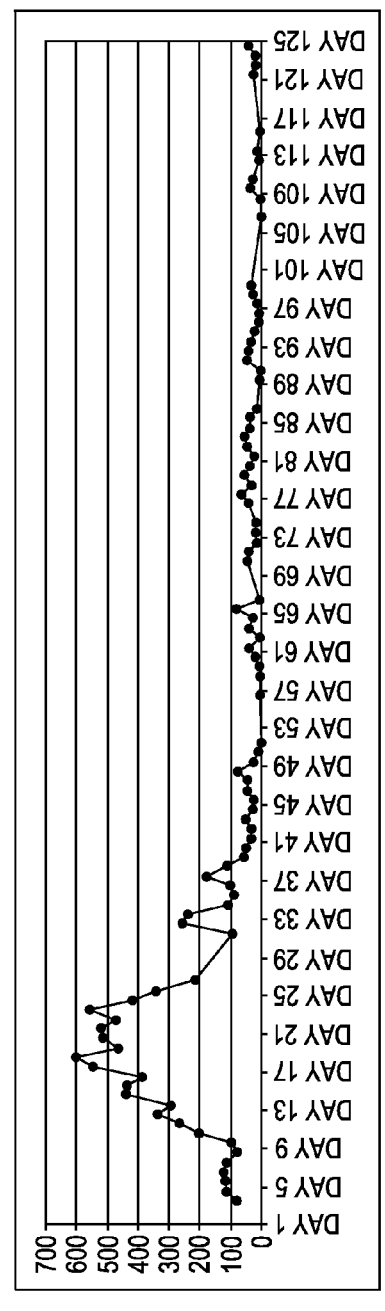
FIG. 6B graphically depicts a daily oscillation metric derived from oscillations of a temperature variable of the component(s) being cooled, in accordance with one or more aspects of the present invention.
Figure 6C:
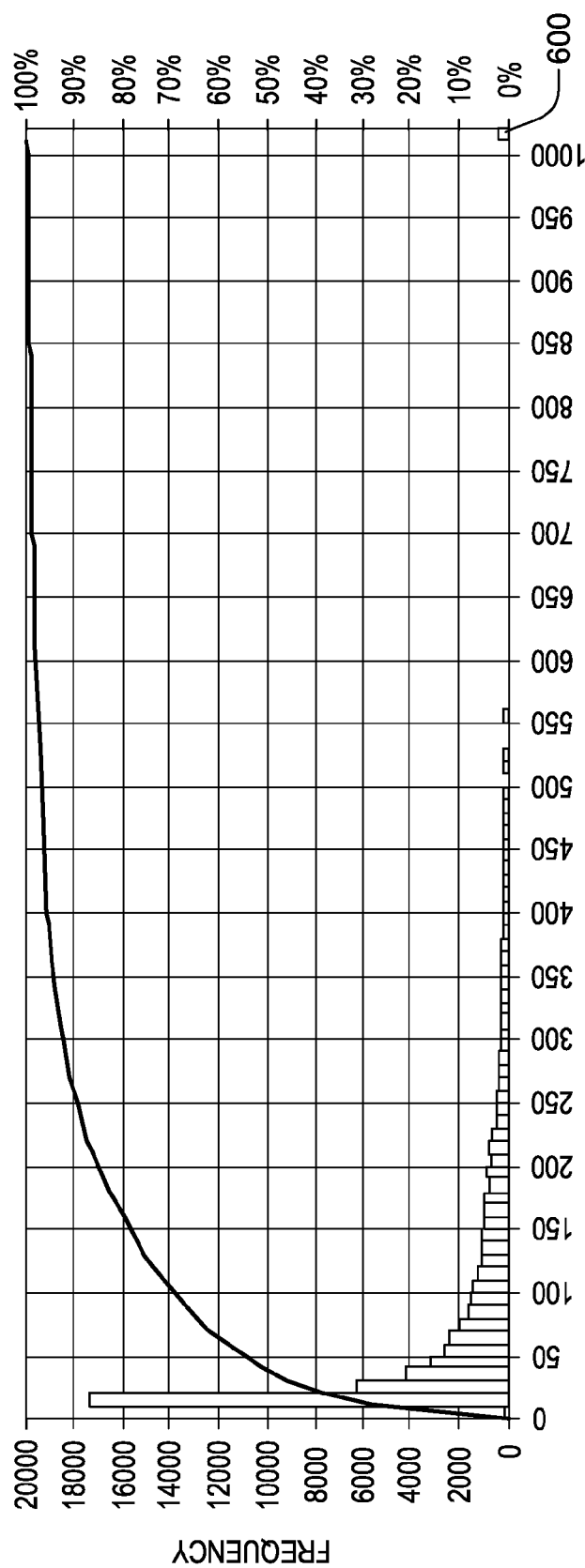
FIG. 6C graphically depicts a number of cooling systems monitored and illustrates identification of one or more outlier cooling systems with excessive daily oscillation metrics, in accordance with one or more aspects of the present invention.

In FIG. 6A, chip temperature data is plotted before and after PID parameters are changed for a node comprising five processor chips, plotted over a four-month time interval. FIG. 6B depicts the daily oscillation metrics for the corresponding data, before and after the PID parameter changes, plotted over the same time interval. Note with respect to FIG. 6B that the DOM exhibits no sensitivity to set point shifts, and little sensitivity to spikes or gaps, but is sensitive to increased reporting frequency. In FIG. 6C, the daily oscillation metrics are plotted against frequency of occurrence, wherein a small number of daily oscillation metrics 600 are illustrated to be outliers. It is these outliers which are to be identified and addressed, in accordance with the aspects of the present invention.

The solutions disclosed herein condense (in one implementation) the daily oscillation metrics into a value for each cooling loop. This value is referred to herein as the oscillation metric. The average of the daily oscillation metric over a time interval, for example, three months, may be used, and a percentage of days with the daily oscillation metric above a threshold (for example, in the case of a temperature-based operational variable, 150° C.) may be determined. Further, the weighted moving average of the daily oscillation metric may be considered.

Figure 7A:
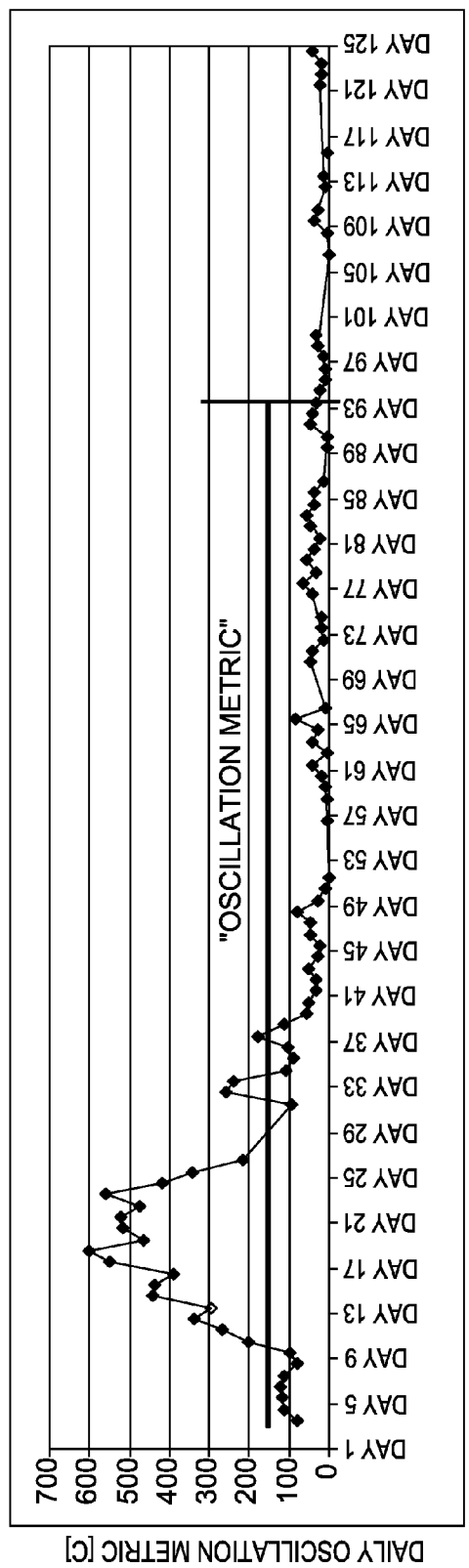
FIG. 7A graphically depicts condensing of daily oscillation metrics into an oscillation metric for a cooling loop of a cooling system, in accordance with one or more aspects of the present invention.

By way of example, FIG. 7A depicts an exemplary oscillation metric illustrating a number of daily oscillation metrics above, for example, 150° C. As described below in connection with FIG. 7B, periodically, or on demand, the oscillation metric may be evaluated to determine, for example, whether at any given time it exceeds an acceptable threshold, threshold2. By way of example, threshold2 might comprise 200° C. in an example where the operational variable is processor chip temperature. If the oscillation metric exceeds threshold2, then control of the cooling system may be dynamically adjusted to limit the variation of the operational variable. This may include changing PID control parameters employed in the MRU control (in one example).

Figure 7B:
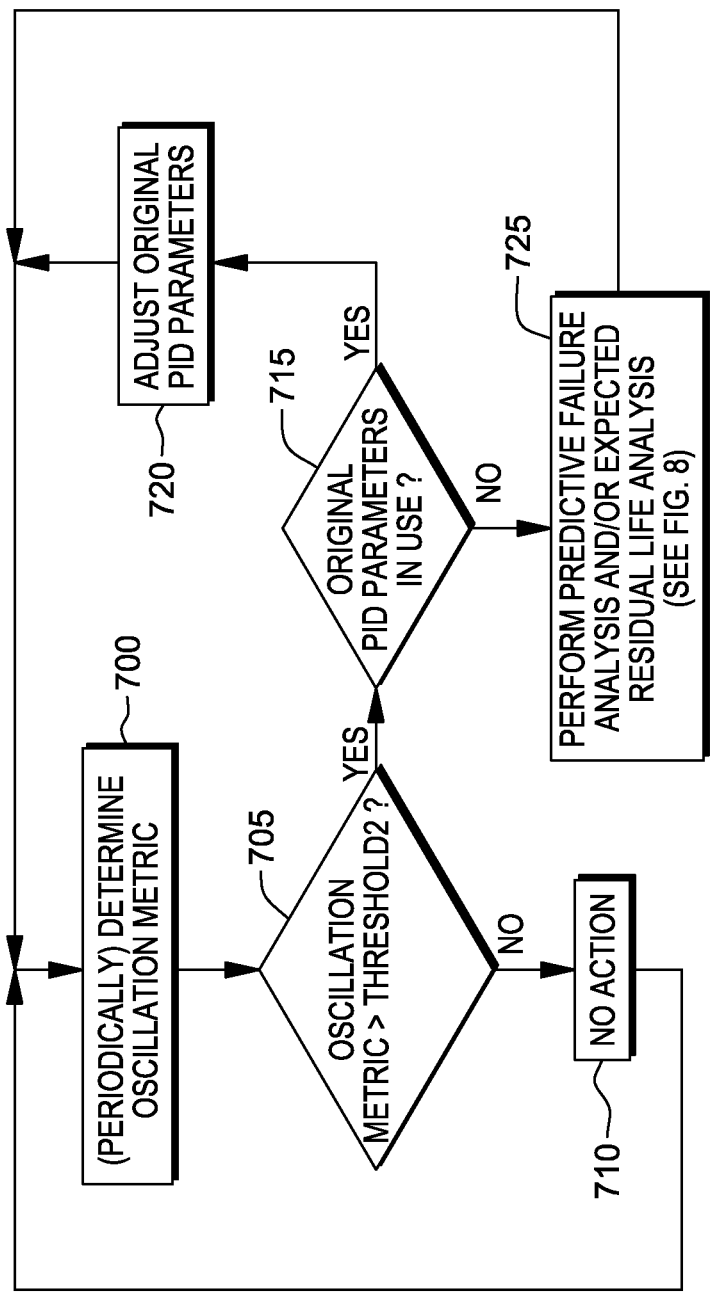
FIG. 7B is a flowchart of one embodiment of a control process which includes automatically adjusting PID parameter control of a cooling system, in accordance with one or more aspects of the present invention.
Figure 8:
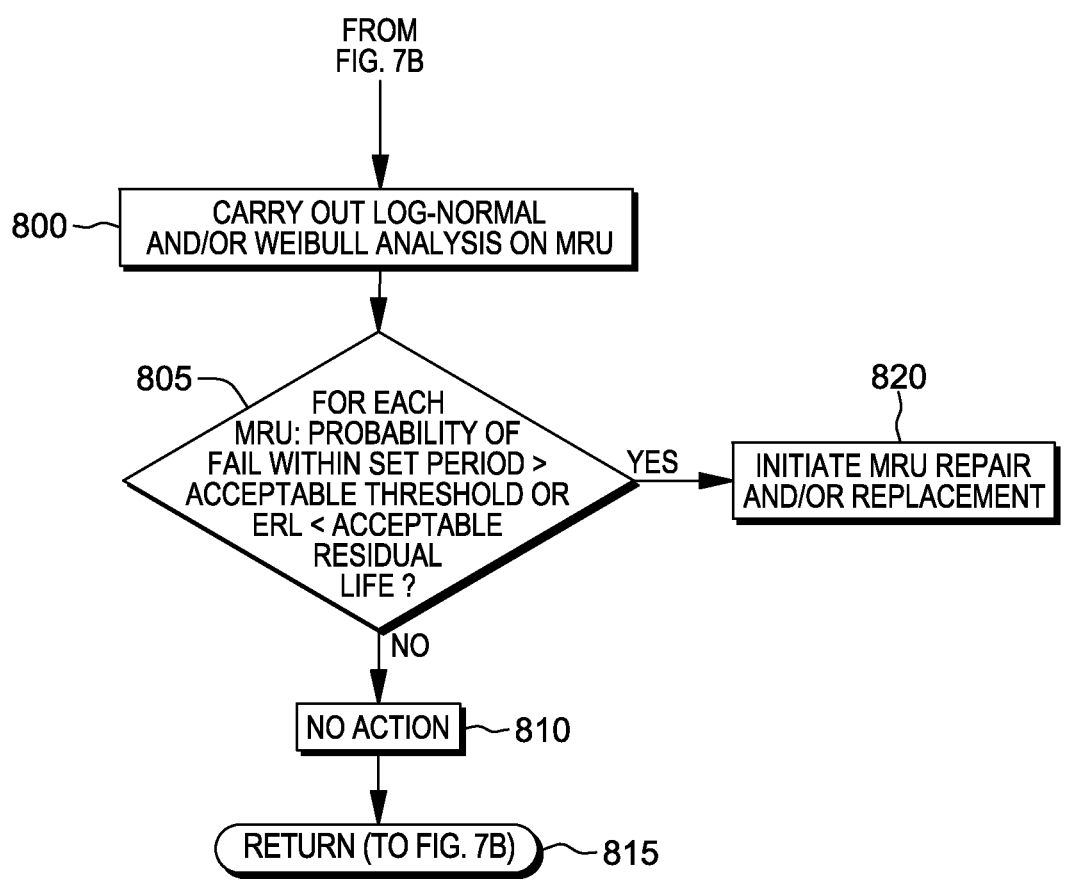
FIG. 8 is a flowchart of one embodiment of a process for performing predictive failure analysis and/or expected residual life analysis on one or more elements of a cooling system, in accordance with one or more aspects of the present invention.

Referring to the processing of FIG. 7B, in one implementation, the remote monitor/control periodically determines an oscillation metric by condensing the daily oscillation metrics into a single value for each cooling loop 700. Each oscillation metric is then compared against an acceptable threshold, threshold2 for the oscillation metric, and processing determines whether the oscillation metric is greater than the set threshold 705. Assuming that the oscillation metric is below the acceptable threshold 705, then no action 710 is taken. Otherwise, processing determines whether control of the respective cooling loop has been previously adjusted by determining, for example, whether the original PID parameters are still in use within the respective cooling loop 715. If "yes", then (in one implementation) the original PID parameters are dynamically adjusted 720 to limit the variation of the operational variable, and thereby reduce the oscillation metric. If the original PID parameters are no longer in use in the respective cooling loop, and the oscillation metric exceeds the acceptable threshold, then (in one implementation) processing automatically performs predictive failure analysis and/or expected residual life analysis on one or more components of the cooling loop 725. One embodiment of this analysis is depicted in FIG. 8 for a cooling loop comprising a modular refrigeration unit such as described above with reference to FIGS. 1A, 1B, 3A & 3B.

Note that in an alternate implementation, performing predictive failure analysis and/or expected residual life analysis, could be independent of the oscillation metric evaluation and/or the dynamic PID parameter change. It might be automatically performed, for example, based on operator request or automatically periodically, such as monthly. In the description provided below, the cooling loop at issue is assumed to comprise a modular refrigeration unit with a compressor, and an electronic control or expansion valve(s). Referring to FIG. 8, performing predictive failure analysis may include carrying out log-normal and/or Weibull analysis for each cooling loop, that is, on each MRU 800. Additionally, or alternatively, the expected residual life (ERL) for each MRU may be determined based on Weibull analysis for the probability of compressor fails and/or log-normal analysis for electronic expansion valve fails. If the probability of fail of a particular MRU within a set period is greater than an acceptable threshold, or the expected residual life for that MRU is less than an acceptable residual life threshold 805, then processing may automatically initiate, for example, schedule MRU repair and/or replacement 820, otherwise, no action is taken 810, and processing returns 815 to, for example, the processing flow of FIG. 7B to continue evaluation of the oscillation metric.

By way of example, conditional failure distribution under Weibull and log-normal with covariate may be determined using Equations (1) & (2) below.

Assuming T to be life of the refrigeration unit, and the underlying distribution to be log-normal with covariates, then predicting probability of fail after an extra δT may be determined by:

$$P(X \le T+\delta T | X > T) = 1 - \frac{\Phi\left(\frac{-\ln(T+\delta T)+\left(\mu+\sum_{i=1}^n \alpha_i y_i\right)}{\sigma}\right)}{\Phi\left(\frac{-\ln T+\left(\mu+\sum_{i=1}^n \alpha_i \gamma_i\right)}{\sigma}\right)}, \qquad (1)$$

where:
Φ is the normal cumulative distribution function;
μ is the location parameter;
σ is the scale parameter; and
$\gamma_i$ and $\alpha_i$, i=1 . . . n are covariates and their covariates coefficients, respectively.

Assuming T to be life of the refrigeration unit and the underlying distribution to be Weibull with covariates, then predicting probability of fail may be determined by employing:

$$P(X \le T+\delta T | X > T) = 1 - \exp\left(-\left\{\left(\frac{T+\delta T}{\beta*}\right)^c - \left(\frac{T}{\beta*}\right)^c\right\}\right), \qquad (2)$$

where:
c is the shape parameter;
β is the scale parameter;
$\beta^*$ is $=\beta\exp(\Sigma_{i=1}^n \alpha_i \gamma_i)$; and
$\gamma_i$ and $\alpha_i$, i=1 . . . n are covariates and their covariates coefficients, respectively.

Given a probability threshold $P_t$, then one can solve Equation (1) or Equation (2) for δT.

The log-normal and Weibull expected residual life with covariates may be determined, in one embodiment, using Equations (3) & (4), set out below.

Suppose that an MRU is of age T. Then in the case of log-normal distribution with covariates, the expected residual life (ERL) may be given by:

$$E(X|T) = \exp\left(\mu + \sum_{i=1}^n a_i y_i + \frac{\sigma^2}{2}\right) \frac{\Phi\left(\frac{-\ln T+\left(\mu+\sum_{i=1}^n a_i y_i\right)+\sigma^2}{\sigma}\right)}{\Phi\left(\frac{-\ln T+\left(\mu+\sum_{i=1}^n a_i y_i\right)}{\sigma}\right)} - T, \qquad (3)$$

where:
Φ is the normal cumulative distribution function;
μ is the location parameter;
σ is the scale parameter; and
$\gamma_i$ and $\alpha_i$, i=1 . . . n are covariates and their covariates coefficients, respectively.

Similarly, if the underlying failure distribution is Weibull with covariate, and putting $\beta^*=\beta\exp(\Sigma_{i=1}^n \alpha_i \gamma_i)$, then:

$$E(X|T) = \beta^* \Gamma\left[\frac{1}{c}+1\right] \exp\left(\left(\frac{T}{\beta*}\right)^c\right)\left(1 - F_{Gamma(\frac{1}{c}+1,1)}\left[\left(\frac{T}{\beta*}\right)^c\right]\right) - T, \qquad (4)$$

where:
c is the shape parameter;
β is the scale parameter;
$\beta^*=\beta\exp(\Sigma_{i=1}^n \alpha_i \gamma_i)$;
Γ is the Gamma function;

$\gamma_i$ and $\alpha_i$, i=1 . . . n are covariates and their covariates coefficients, respectively; and F is the cdf of Gamma distribution with $$\alpha = \frac{1}{c+1}$$

and $\beta=1$.

In one example, the acceptable residual life might comprise 2 months, and if the expected residual life is less than the acceptable residual life, then the remote monitor/control may automatically initiate repair or replacement of the respective MRU.

Note that modification of operating parameters during the life of an element of the cooling system can change the reliability of the element. If lifetime of parts are distributed according to a log-normal, then this change in regime could modify the hazard rate, and therefore distribution parameters should be expected to change accordingly. Proposed herein is a definition of equivalent life and a modification of a likelihood function to calculate this new set of parameters.

In a given cohort of part, let T' be the life of a part prior to any changes. At T', a change is introduced in operating conditions and the parts live for an extra duration T. Assuming that there is a bundle of parts with different ages, some of which have seen a change in operating conditions and such that a fraction of these parts have failed, some before and some after the changes in operating conditions, the resultant failure distribution can be determined.

If one assumes that the underlying failure distribution is log-normal, then with a proper censoring scheme, one can fit a log-normal distribution to T*=T'+T, but this straightforward approach does not take into account the possibility of a different hazard rate before and after the change. In fact, the proper functional way to write T* would be:

$$T^* = f(T') + T \quad (5)$$

where f is a function that still have to be explicited.

Assume that the failure distribution prior to any change is characterized by the pair $(\mu_1, \sigma_1)$. After the change, these parameters have shifted to $(\mu_2, \sigma_2)$. Therefore, the equivalent time to fit to a log-normal distribution is rescaled to:

$$T^* = \exp\left(\mu_2 - \mu_1 \frac{\sigma_2}{\sigma_1}\right) T'^{\frac{\sigma_2}{\sigma_1}} + T. \quad (6)$$

In fact, when T=0, it is easy to verify that:

$$\frac{\ln\left(\exp\left(\mu_2 - \mu_1 \frac{\sigma_2}{\sigma_1}\right) T'^{\frac{\sigma_2}{\sigma_1}}\right) - \mu_2}{\sigma_2} = \frac{\ln(T') - \mu_1}{\sigma_1}, \quad (7)$$

so that the cumulative hazard of T' under $(\mu_1, \sigma_1)$ is equal to the cumulative hazard of T* under $(\mu_2, \sigma_2)$. To obtain parameter pairs $(\mu_1, \sigma_1)$ and $(\mu_2, \sigma_2)$, we have to modify somewhat the log-likelihood function:

$$LL = -\sum_{i=1}^{n} \log\left(\frac{\phi\left(\exp\left(\mu_2 - \mu_1 \frac{\sigma_2}{\sigma_1}\right) T'^{\frac{\sigma_2}{\sigma_1}} + T\right), \mu_2, \sigma_2)}{1 - \Phi\left(-\ln\left(\exp\left(\mu_2 - \mu_1 \frac{\sigma_2}{\sigma_1}\right) T'^{\frac{\sigma_2}{\sigma_1}} + T\right), \mu_2, \sigma_2\right)}\right) - \quad (8)$$

$$\sum_{i=1}^{n} \log\left(1 - \Phi\left(-\ln\left(\exp\left(\mu_2 - \mu_1 \frac{\sigma_2}{\sigma_1}\right) T'^{\frac{\sigma_2}{\sigma_1}} + T\right), \mu_2, \sigma_2\right)\right),$$

where $\phi$ and $\Phi$ are the log-normal pdf and cdf, respectively.

The first summation in Equation (8) is the negative of the sum of the log hazard for failed parts, and the second summation is the negative of the sum of log cumulative hazard for all parts.

Therefore, one is attempting to find parameters $(\mu_1, \sigma_1)$ and $(\mu_2, \sigma_2)$ that maximize Equation (8). This can be achieved with a non-linear optimization routine (available in many statistical software programs), and once parameters are obtained, one can proceed to calculate equivalent life. Furthermore, if covariates are available, then they can be tested for significance with respect to equivalent life.

Note that disclosed herein is the concept of using monitoring over a period of time of one or more operational variables of a cooling system or of a component being cooled by the cooling system, to determine whether to adjust control of the cooling system to limit the variation of the operational variables. In one example, the operational variable is a component temperature, and the control of the cooling system may involve automatic control of one or more PID control parameters. This automatic adjustment may be without interruption to the cooling system or the electronic system being cooled. In cases where insufficient improvement is noted, then a predictive method, based (for example) on Weibull and/or log-normal analysis, may be employed to identify cooling loops, and thus, respective refrigeration units, which may fail soon or have a low expected residual life, so that maintenance or replacement of the respective cooling loop or refrigeration unit can be initiated proactively. Note that the mathematical equations described herein take into account the possibility of a change in PID control parameters during the life of the MRU, and still allow for proper Weibull and/or log-normal analysis to be performed.

As will be appreciated by one skilled in the art, one or more aspects of the present invention may be embodied as a system, method or computer program product. Accordingly, one or more aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system". Furthermore, one or more aspects of the present invention may take the form of a computer program product embodied in one or more computer readable medium(s) having computer readable program code embodied thereon.

Any combination of one or more computer readable medium(s) may be utilized. The computer readable medium may be a computer readable storage medium. A computer readable storage medium may be, for example, but not limited to, an electronic, magnetic, optical, electromagnetic, infrared or semiconductor system, apparatus, or device, or any suitable combination of the foregoing. More specific examples (a non-exhaustive list) of the computer readable storage medium include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus, or device.

Figure 9:
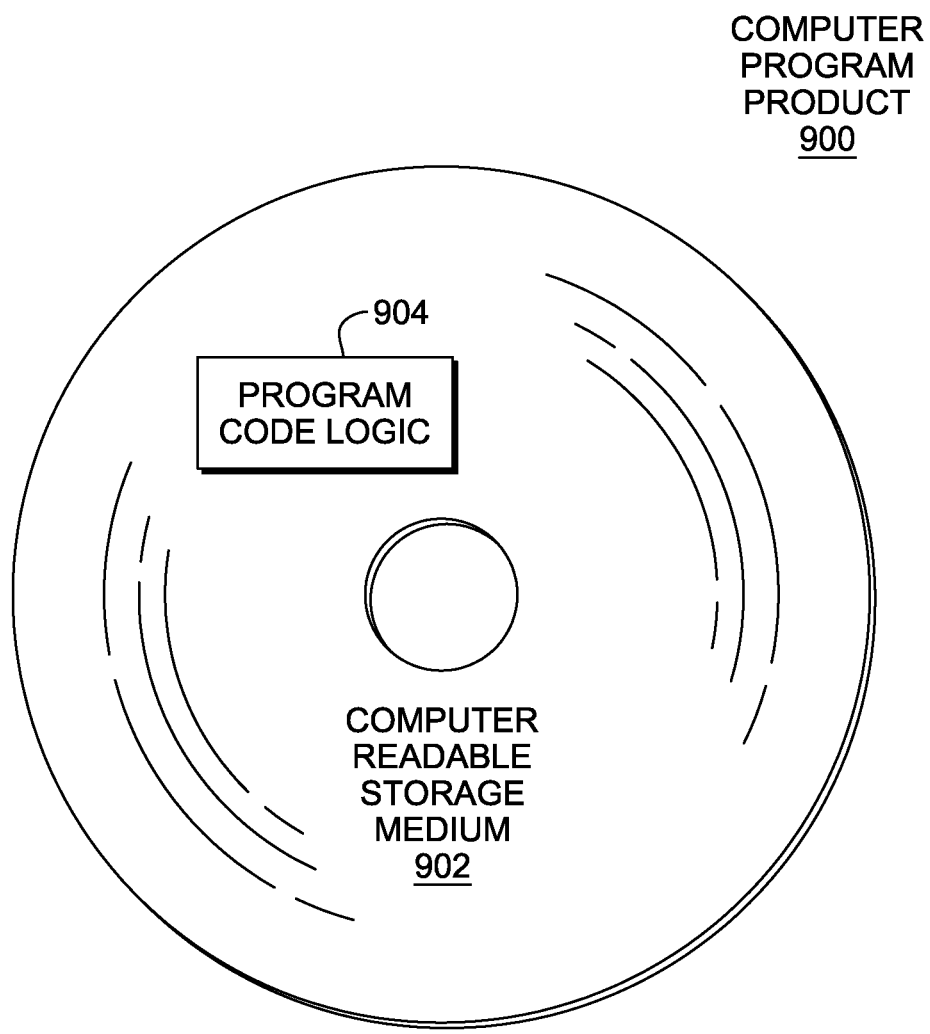
FIG. 9 depicts one embodiment of a computer program product incorporating one or more aspects of the present invention.

Referring now to FIG. 9, in one example, a computer program product 900 includes, for instance, one or more non-transitory computer readable storage media 902 to store computer readable program code means or logic 904 thereon to provide and facilitate one or more aspects of the present invention.

Program code embodied on a computer readable medium may be transmitted using an appropriate medium, including but not limited to, wireless, wireline, optical fiber cable, RF, etc., or any suitable combination of the foregoing.

Computer program code for carrying out operations for one or more aspects of the present invention may be written in any combination of one or more programming languages, including an object oriented programming language, such as Java, Smalltalk, C++ or the like, and conventional procedural programming languages, such as the "C" programming language, assembler or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

One or more aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods and computer program products according to various embodiments of one or more aspects of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

In addition to the above, one or more aspects of the present invention may be provided, offered, deployed, managed, serviced, etc. by a service provider who offers management of customer environments. For instance, the service provider can create, maintain, support, etc. computer code and/or a computer infrastructure that performs one or more aspects of the present invention for one or more customers. In return, the service provider may receive payment from the customer under a subscription and/or fee agreement, as examples. Additionally or alternatively, the service provider may receive payment from the sale of advertising content to one or more third parties.

In one aspect of the present invention, an application may be deployed for performing one or more aspects of the present invention. As one example, the deploying of an application comprises providing computer infrastructure operable to perform one or more aspects of the present invention.

As a further aspect of the present invention, a computing infrastructure may be deployed comprising integrating computer readable code into a computing system, in which the code in combination with the computing system is capable of performing one or more aspects of the present invention.

As yet a further aspect of the present invention, a process for integrating computing infrastructure comprising integrating computer readable code into a computer system may be provided. The computer system comprises a computer readable medium, in which the computer medium comprises one or more aspects of the present invention. The code in combination with the computer system is capable of performing one or more aspects of the present invention.

Although various embodiments are described above, these are only examples. Further, other types of computing environments can benefit from one or more aspects of the present invention.

As a further example, a data processing system suitable for storing and/or executing program code is usable that includes at least one processor coupled directly or indirectly to memory elements through a system bus. The memory elements include, for instance, local memory employed during actual execution of the program code, bulk storage, and cache memory which provide temporary storage of at least some program code in order to reduce the number of times code must be retrieved from bulk storage during execution.

Input/Output or I/O devices (including, but not limited to, keyboards, displays, pointing devices, DASD, tape, CDs, DVDs, thumb drives and other memory media, etc.) can be coupled to the system either directly or through intervening I/O controllers. Network adapters may also be coupled to the system to enable the data processing system to become coupled to other data processing systems or remote printers or storage devices through intervening private or public networks. Modems, cable modems, and Ethernet cards are just a few of the available types of network adapters.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A control system for controlling operation of a cooling system cooling at least one component, the control system comprising:
   a memory;
   a processor coupled to the memory and configured to facilitate performing a method comprising:
      monitoring over a period of time variation of an operational variable of the cooling system or of the at least one component cooled by the cooling system; and
      based, at least, in part, on the variation of the operational variable over the period of time, determining whether to adjust control of the cooling system to limit the variation of the operational variable.

2. The control system of claim 1, further comprising determining, from the variation of the operational variable over the period of time, an oscillation metric representative of the variation of the operational variable over the period of time, and wherein the determining whether to adjust control of the cooling system comprises determining whether the oscillation metric exceeds a set threshold, and based on the oscillation metric exceeding the set threshold, the method further comprises adjusting at least one control parameter of the cooling system to, at least in part, reduce the oscillation metric.

3. The control system of claim 2, wherein the monitoring comprises obtaining a set of data representative of the variation of the operational variable over the period of time, and determining the oscillation metric comprises, at least in part, summing multiple operational variable changes within the set of data to obtain a time-period-based metric representative of the variation of the operational variable over the period of time, and further deriving from multiple time-period-based metrics the oscillation metric.

4. The control system of claim 2, wherein the cooling system comprises a proportional-integral-derivative control and the adjusting at least one control parameter comprises automatically adjusting at least one of a proportional gain, an integral gain, or a derivative gain of the proportional-integral-derivative control to, at least in part, reduce the oscillation metric.

5. The control system of claim 1, wherein the determining further comprises ascertaining that variation of the operational variable over the period of time is excessive, and that control of the cooling system has been previously adjusted to limit the variation of the operational variable over the period of time, and based thereon, determining a probability of fail for at least one element of the cooling system or an expected residual life of at least one element of the cooling system, and depending on the probability of fail exceeding a first acceptable threshold or the expected residual life being below a second acceptable threshold, automatically signaling for a repair or replacement of at least a portion of the cooling system.

6. The control system of claim 1, further comprising predicting probability of fail of at least one element of the cooling system or determining an expected residual life of at least one element of the cooling system, and responsive to the predicted probability of fail exceeding a first acceptable threshold, or the expected residual life being below a second acceptable threshold, automatically signaling for a repair or replacement of at least a portion of the cooling system, and wherein the cooling system comprises a refrigeration unit and the predicting probability of fail or determining expected residual life comprises performing at least one of Weibull analysis on a compressor of the refrigeration unit or log-normal analysis on an electronic expansion valve of the refrigeration unit.

7. A computer program product for facilitating operation of a cooling system cooling at least one component, the computer program product comprising:
   a computer-readable storage medium readable by a processor and storing instructions for execution by the processor to perform a method comprising:
      monitoring over a period of time variation of an operational variable of the cooling system or of the at least one component cooled by the cooling system; and
      based, at least in part, on the variation of the operational variable over the period of time, determining Whether to adjust control of the cooling system to limit the variation of the operational variable.

8. The computer program product of claim 7, wherein the method further comprises determining, from the variation of the operational variable over the period of time, an oscillation metric representative of the variation of the operational variable over the period of time, and wherein the determining whether to adjust control of the cooling system comprises determining whether the oscillation metric exceeds a set threshold, and based on the oscillation metric exceeding the set threshold, the method further comprises adjusting at least one control parameter of the cooling system to, at least in part, reduce the oscillation metric.

9. The computer program product of claim 8, wherein the monitoring comprises obtaining a set of data representative of the variation of the operational variable over the period of time, and determining the oscillation metric comprises, at least in part, summing multiple operational variable changes within the set of data to obtain a time-period-based metric representative of the variation of the operational variable over the period of time, and further deriving from multiple time-period-based metrics the oscillation metric.

10. The computer program product of claim 8, wherein the cooling system comprises a proportional-integral-derivative control and the adjusting at least one control parameter comprises automatically adjusting at least one of a proportional gain, an integral gain, or a derivative gain of the proportional-integral-derivative control to, at least in part, reduce the oscillation metric.

11. The computer program product of claim 7, wherein the cooling system cools multiple components, and comprises multiple cooling loops, each cooling loop of the multiple cooling loops cooling at least one respective component of the multiple components, and wherein the monitoring comprises, for each cooling loop, monitoring over the period of time variation of the operational variable associated with that cooling loop or the at least one respective component cooled by that cooling loop, and based, at least in part, on the variation of the operational variable over the period of time, determining for each cooling loop whether to adjust control of that cooling loop to limit the variation of the operational variable.

12. The computer program product of claim 11, wherein the cooling system comprises a refrigeration unit, and the operational variable comprises an operational temperature associated with the cooling loop or the at least one respective component cooled by that cooling loop, and wherein the method further comprises adjusting control of the refrigeration unit to, at least in part, limit the variation of the operational variable, the adjusting control comprising automatically adjusting control of an electronic expansion valve of the refrigeration unit.

13. The computer program product of claim 7, wherein the determining further comprises ascertaining that variation of the operational variable over the period of time is excessive, and that control of the cooling system has been previously adjusted to limit the variation of the operational variable over the period of time, and based thereon, determining a probability of fail for at least one element of the cooling system or an expected residual life of at least one element of the cooling system, and depending on the probability of fail exceeding a first acceptable threshold or the expected residual life being below a second acceptable threshold, automatically signaling for a repair or replacement of at least a portion of the cooling system.

14. The computer program product of claim 7, wherein the method further comprises predicting probability of fail of at least one element of the cooling system or determining an expected residual life of at least one element of the cooling system, and responsive to the predicted probability of fail exceeding a first acceptable threshold, or the expected residual life being below a second acceptable threshold, automatically signaling for repair or replacement of at least a portion of the cooling system.

15. The computer program product of claim 14, wherein the cooling system comprises a refrigeration unit and the predicting probability of fail or determining expected residual life comprises performing at least one of Weibull analysis on a compressor of the refrigeration unit or log-normal analysis on an electronic expansion valve of the refrigeration unit.

16. The computer program product of claim 15, wherein setting T to be life of the refrigeration unit, and the underlying distribution to be log-normal with covariates, then the predicting probability of fail after an extra ST is determined by:

$$P(X \leq T + \delta T | X > T) = 1 - \frac{\Phi\left(\frac{-\ln(T + \delta T) + \left(\mu + \sum_{i=1}^{n} \alpha_i \gamma_i\right)}{\sigma}\right)}{\Phi\left(\frac{-\ln T + \left(\mu + \sum_{i=1}^{n} \alpha_i \gamma_i\right)}{\sigma}\right)},$$

where:

$\Phi$ is the normal cumulative distribution function;

$\mu$ is the location parameter;

$\sigma$ is the scale parameter; and $\gamma_i$ and $\alpha_i$, i=1 . . . n are covariates and their covariates coefficients, respectively.

17. The computer program product of claim 15, wherein setting T to be life of the refrigeration unit and the underlying distribution to be Weibull with covariates, then predicting probability of fail employs:

$$P(X \leq T + \delta T | X > T) = 1 - \exp\left(-\left\{\left(\frac{T + \delta T}{\beta*}\right)^c - \left(\frac{T}{\beta*}\right)^c\right\}\right),$$

where:

c is the shape parameter;

$\beta$ is the scale parameter;

$\beta*$ is $=\beta \exp(\Sigma_{i=1}^{n} \alpha_i \gamma_i)$; and $\gamma_i$ and $\alpha_i$, i=1 . . . n are covariates and their covariates coefficients, respectively.

18. The computer program product of claim 15, wherein setting the refrigeration unit to be of age T, and the underlying distribution to be log-normal with covariates, then determining the expected residual life is determined by:

$$E(X|T) = \exp\left(\mu + \sum_{i=1}^{n} \alpha_i y_i + \frac{\sigma^2}{2}\right) \frac{\Phi\left(\frac{-\ln T + \left(\mu + \sum_{i=1}^{n} \alpha_i y_i\right) + \sigma^2}{\sigma}\right)}{\Phi\left(\frac{-\ln T + \left(\mu + \sum_{i=1}^{n} \alpha_i y_i\right)}{\sigma}\right)} - T,$$

where:

$\Phi$ is the normal cumulative distribution function;

$\mu$ is the location parameter;

$\sigma$ is the scale parameter; and $\gamma_i$ and $\alpha_i$, i=1 . . . n are covariates and their covariates coefficients, respectively.

19. The computer program product of claim 15, wherein setting T to be the age of the refrigeration unit, and the underlying distribution to be Weibull with covariates, then determining the expected residual life employs:

$$E(X|T) = \beta^* \Gamma\left[\frac{1}{c} + 1\right] \exp\left(\left(\frac{T}{\beta^*}\right)^c\right)\left(1 - F_{Gamma(\frac{1}{c}+1,1)}\left[\left(\frac{T}{\beta^*}\right)^c\right]\right) - T,$$

where:
- c is the shape parameter;
- β is the scale parameter;
- $\beta^* = \beta \exp(\Sigma_{i=1}^{n} \alpha_i \gamma_i)$;
- Γ is the Gamma function;
- $\gamma_i$ and $\alpha_i$, i=1 . . . n are covariates and their covariates coefficients, respectively; and
- F is the cdf of Gamma distribution with $$\alpha = \frac{1}{c+1}$$

and β=1.

* * * * *